(12) United States Patent
Müller et al.

(10) Patent No.: US 6,867,970 B2
(45) Date of Patent: Mar. 15, 2005

(54) MODULAR CONVERTER UNIT

(75) Inventors: Hans-Jürgen Müller, Herzogenaurach (DE); Ingolf Hoffmann, Herzogenaurach (DE); Thomas Weichselbaum, Nürnberg (DE); Volker Schinn, Erlangen (DE); Georg Dengler, Hirschaid (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/793,142

(22) Filed: Mar. 4, 2004

(65) Prior Publication Data

US 2004/0223301 A1 Nov. 11, 2004

Related U.S. Application Data

(63) Continuation of application No. PCT/DE02/03933, filed on Oct. 17, 2002.

(30) Foreign Application Priority Data

Oct. 31, 2001 (DE) .......................................... 101 53 748

(51) Int. Cl.[7] ................................................ H05K 7/20
(52) U.S. Cl. ........................ 361/695; 361/690; 361/704; 165/104.33; 165/185; 363/141
(58) Field of Search ................................ 361/622–624, 361/627, 688–690, 703, 704; 363/141; 165/80.3, 104.33, 185; 174/16.1, 16.3

(56) References Cited

U.S. PATENT DOCUMENTS

| | | | | |
|---|---|---|---|---|
| 4,639,834 A | * | 1/1987 | Mayer ........................ | 361/710 |
| 5,245,527 A | * | 9/1993 | Duff et al. .................. | 363/131 |
| 6,477,965 B2 | * | 11/2002 | Yamaguchi et al. .......... | 105/59 |
| 6,493,227 B2 | * | 12/2002 | Nielsen et al. .............. | 361/703 |
| 6,754,066 B2 | * | 6/2004 | Doan et al. ................. | 361/600 |

FOREIGN PATENT DOCUMENTS

| | | |
|---|---|---|
| DE | 198 45 821 A | 4/2000 |
| EP | 0 655 881 A | 5/1995 |
| GB | 2 178 243 A | 2/1987 |

* cited by examiner

Primary Examiner—Boris Chervinsky
(74) Attorney, Agent, or Firm—Henry M. Feierisen (57) ABSTRACT

A modular converter unit and a power converter assembly having at least one modular converter unit are described. The converter unit includes a two-sided cooling device and an intermediate circuit capacitor battery with several capacitors that are arranged one on top of the other in a mounting frame. A power module with a control component and a conductor rail system is arranged on one or more mounting plates. The mounting frame is finished with metal sheets for forming channel. A compact converter unit can thus be produce a series of universal modular converter assemblies at low cost.

18 Claims, 11 Drawing Sheets

MODULAR CONVERTER UNIT

CROSS-REFERENCES TO RELATED APPLICATIONS

This application is a continuation of prior filed copending PCT International application no. PCT/DE02/03933, filed Oct. 17, 2002, which designated the United States and on which priority is claimed under 35 U.S.C. §120, the disclosure of which is hereby incorporated by reference.

This application claims the priority of German Patent Application, Serial No. 101 53 748.4, filed Oct. 31, 2001, pursuant to 35 U.S.C. 119(a)–(d), the disclosure of which is incorporated herein by reference.

BACKGROUND OF THE INVENTION

The present invention relates to a modular converter unit, and to a power converter assembly which includes at least one modular converter unit.

British Pat. No. GB 2 178 243 A describes a compact power assembly, consisting of two power units. Each power units has several branch pair modules which are mounted on a support plate of a cooling unit. The two power units are arranged on opposite sides of the compact power assembly and combined with their respective cooling units so as to eliminate gaps between the cooling units and the assembled support plate. The assembly is held together with two plates. This compact power assembly also includes a fan unit which is connected by a cooling air channel with the intake side of the two cooling units of the compact power assembly. The branch modules of each power unit are electrically connected with each other by a printed circuit board that includes control and/or protection devices. The terminals of the branch modules of each power unit are distributed on the printed circuit board in such a way that the AC-terminals are located on one side, while the DC-terminals are located on the opposite side. The DC-side terminals of the two power units can then be connected with each other by an intermediate circuit choke. The AC-side of one power unit is connected with the power line, while the other power unit is connected with a motor. The power units of a DC voltage intermediate circuit converter can be configured as a compact power assembly instead of a DC intermediate circuit converter.

German Pat. No. DE 198 45 821 A1 describes a modular converter unit, in particular for use in rail cars. This converter unit includes a frame-like or dome-shaped metal housing, such as a housing frame, suitable to house the employed components. A cooling unit is provided on both sides of the housing frame and an intermediate circuit capacitor is provided centrally in the housing frame. IGBT modules are mounted on both sides of the housing frame. A rail system with connecting elements is arranged above the housing frame and electrically connects the terminals of the intermediate circuit capacitor with DC terminals of the IGBT modules. Isolation elements are provided in the region of the contact points between the rail system and the intermediate circuit capacitor. The intermediate circuit capacitor is conventionally mounted on the baseplate in the housing frame. AC terminals of the converter unit are routed to a terminal strip and connected by insulated standoffs with the cooling units and the housing frame. The current rails which preferably consist of wide insulated copper bands are secured to the IGBT outputs, the AC terminals and the insulated standoffs. The current rails terminate on one side, preferably below the housing frame, so that all components are accessible from one side, which allows easy and rapid assembly and disassembly of the converter unit. Openings in the housing frame that are oriented sideways and upwards are covered by a cover plate of the intermediate circuit capacitor and by the cooling units which have circumferential seals. The other opposite sides of the housing frame each have two openings that correspond to the cooling units secured in the housing frame, which also have circumferential seals. The rail system, which is constructed of electrically isolated foil-like conductors stacked one on top of the other, is screwed to the terminals of the intermediate circuit capacitor via the contact points located on the top side of the rail system and with the DC terminals of the IGBT modules via angled lateral straps. The unit in different mounting positions on support rails arranged on the housing frame. The converter unit can be mounted in a container using these mounting rails. The converter unit can be designed for water cooling and air cooling. If air cooling is employed, the cooling surface is formed by cooling fans in a conventional manner. If water cooling is employed, then conventional water connections for supply and discharge of the cooling water are provided, with the fitting arranged on the same side as the terminal strip. This configuration of the converter unit makes the unit compact; the unit can be used, for example, as a phase module in inverters, as a four-quadrant-control control element and/or as a brake actuator and arranged in different combinations. The modular construction allows expansion of the basic configuration to cover different switching and power ranges, whereby different cooling systems can be used. This configuration of the converter unit has slightly less weight and volume.

It would therefore be desirable to provide a low-cost modular converter unit which employs a uniform device design, has identical interfaces and employs standardized switching techniques over its entire power range.

SUMMARY OF THE INVENTION

According to one aspect of the invention, a modular converter unit includes a mounting frame and an intermediate circuit capacitor battery secured to the mounting frame and implemented with a plurality of capacitors. The modular converter unit further includes a two-sided cooling unit adapted to support components on both sides of the cooling unit. and secured to the mounting frame above the intermediate circuit capacitor battery and includes at least a one mounting plate. At least one power semiconductor is mounted on the mounting plate and has a control input connected to a terminal of a control assembly. An intermediate circuit rail system electrically connects the capacitors of the intermediate circuit capacitor battery with each other and with the DC-side terminal of the power semiconductor. A current rail is electrically connected with a corresponding AC-side terminal of the at least one power semiconductor, and a cover plate covers the mounting frame so as to form an air channel.

A modular converter unit according to the present invention is compact in structure and can be connected with additional components to a converter assembly. Assemblies of the same series and representing different power ranges can thereby utilize the same design of the converter unit, while the number of the converter units can vary depending only on the required power and the converter topology.

This advantageous embodiment of the converter unit of the invention therefore houses all power components of the DC intermediate voltage converter in the smallest possible space, even accommodating different power ranges. As a result, converter units are realized having uniform modular configuration and design. Moreover, the converter unit of the invention employs identical interfaces and a uniform switching technique over an entire desired power range.

According to another aspect of the invention, the converter units can be assembled in the form of a converter assembly which includes a base frame, a fan unit and an electronic unit inserted into the base frame. One or more of the aforedescribed converter unit(s) can be inserted into the base frame wherein the fan unit is arranged below the converter unit and the electronic unit is arranged on the side of the converter unit.

Advantageous embodiments of the converter unit can include one or more of the following features. The converter unit can include at least one additional power semiconductor which has a control input and is mounted on a second mounting plate of the two-sided cooling unit. The control input of the additional power semiconductor can be connected to a terminal of an additional control assembly. A first additional current rail can be electrically connected with a corresponding AC-side terminal of the additional power semiconductor and a second additional current rail can be electrically connected with a corresponding DC-side terminal of the additional power semiconductor. A rail section can electrically connect the DC-side terminal of the additional power semiconductor with the intermediate circuit rail system located on the opposite side of the mounting frame. The current rails can include current sensors.

The converter unit can also include a semiconductor fuse arranged between the AC-side terminal of the power semiconductor and the current rail; and a pre-charging resistor mounted on the first mounting plate of the cooling unit and connected between a DC-side terminal of the intermediate circuit capacitor battery and the terminal of the control assembly. The power semiconductor(s) can be implemented as one or more six-pack modules. Alternatively or in addition, the (additional) power semiconductors can be implemented as thyristors.

According to another feature of the present invention, the cooling unit can be air-cooled or liquid-cooled. Suitably, the liquid-cooled cooling unit can be configured so that the capacitors of the intermediate circuit capacitor battery are also liquid-cooled.

Advantageously, the sides and the front of the converter assembly can be covered by cover plates, and the converter assembly can have a power line terminal and motor terminal disposed on the top and the bottom of the converter assembly, respectively. The converter assembly can thus be converted into a built-in device.

The converter units, with or without the additional components, such as the additional power semiconductors, the additional current rails and the rail section, can be combined into a converter assembly. Each converter unit herein has a dedicated fan unit and the converter assembly has a single electronic unit. This provides for a uniform design over the entire power range of a serially produced units and/or assemblies.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Figure 1:
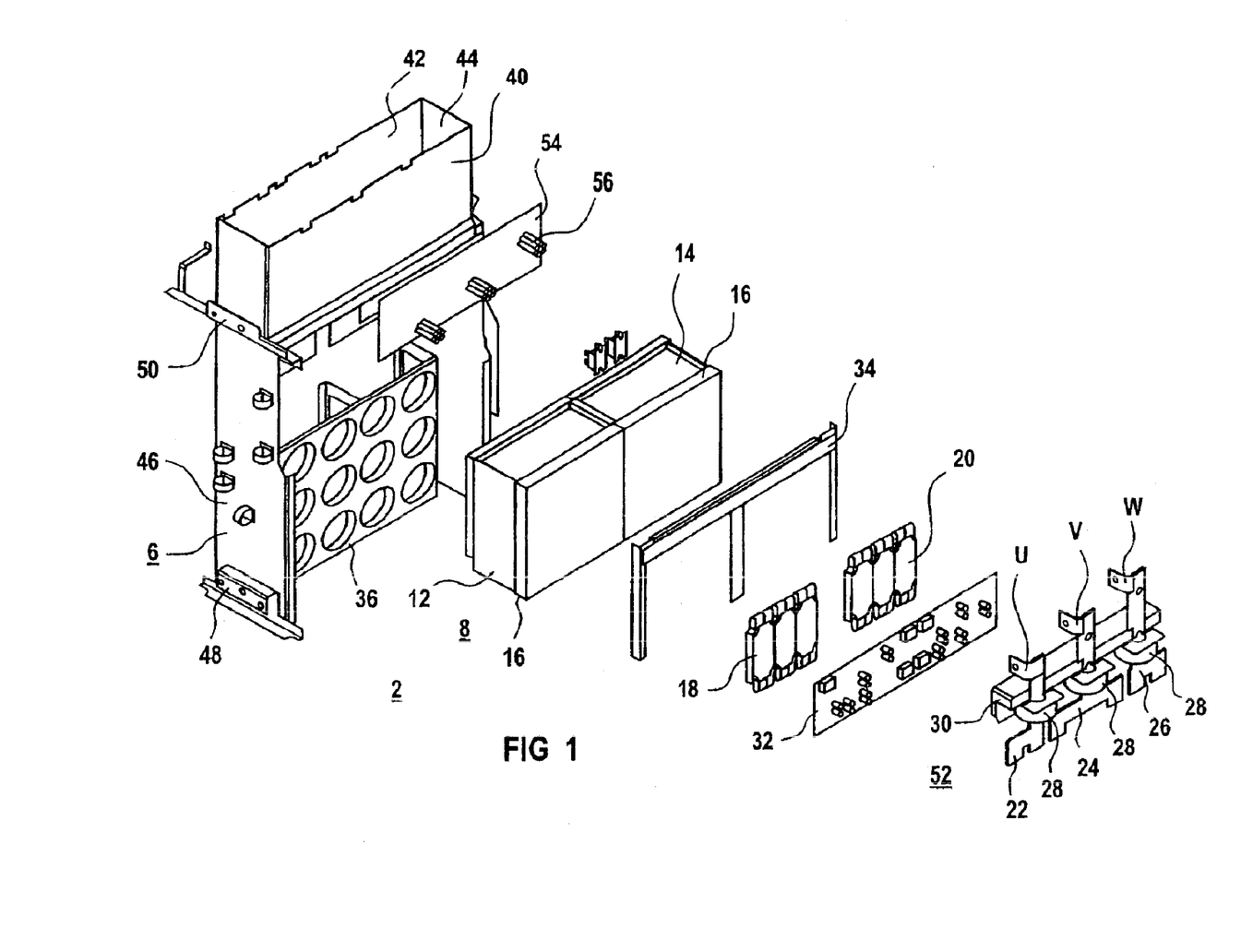
FIG. 1 shows an exploded perspective view of a portion of a converter unit according to the present invention.
Figure 7:
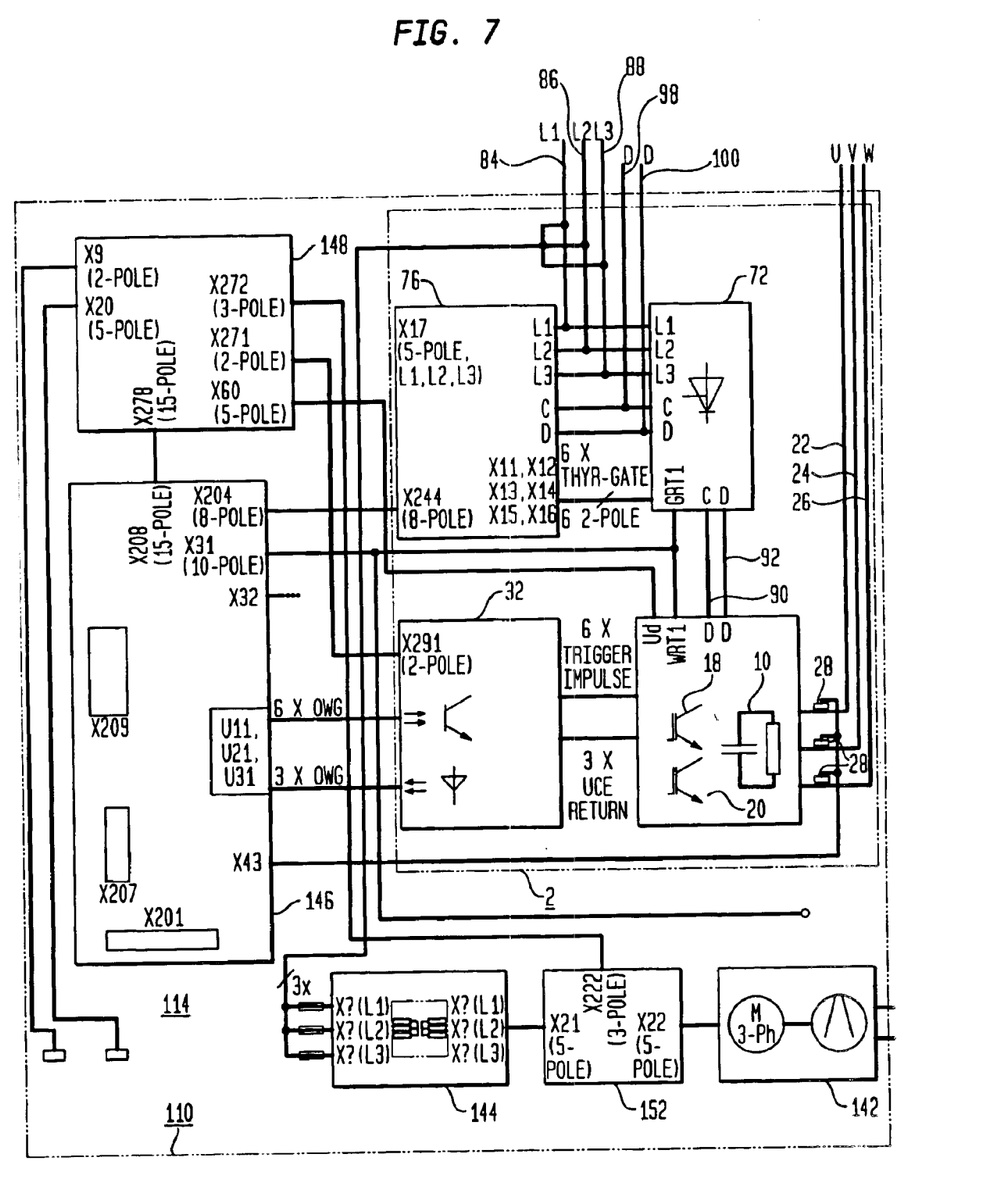
FIG. 7 shows a schematic block diagram of the converter assembly of FIG. 6.

Turning now to the drawing, and in particular to FIG. 1, there is shown an exploded view of a converter unit 2 according to the invention, wherein for sake of clarity of the drawing, only those portions of the converter unit 2 are illustrated that are arranged on the right side of the converter unit 2. The designations right side and left side of the converter unit 2 refer to the direction of insertion of the converter unit into a basic frame 4, as shown in FIG. 7. The converter unit 2 includes a mounting frame 6 which is adapted to receive, on one hand, a cooling unit 8 and, on the other hand, an intermediate circuit capacitor battery 10 (see FIG. 3). The cooling unit 8 in this exemplary embodiment is arranged above the capacitor battery 10. The cooling unit 8 can include, for example, two two-sided cooling elements 12 and 14 on which components can be mounted on both sides. For example, power semiconductors, in particular the depicted power modules 18 and 20, are mounted on a first support plate 16 of the cooling elements 12 and 14. These two power modules 18 and 20 are implemented, for example, as so-called IGBT six-pack modules which are connected with each other so as to form a 6-pulse converter bridge. The circuit is implemented on the AC-side with current rails 22, 24 and 26, wherein the ends of the current rails form the terminals U, V and W. Each of the current rails 22, 24 and 26 includes a current transformer 28, with the signal lines being guided in a guide and support rail 30. A control assembly 32 is mounted on the installed power modules 18 and 20, which generates from supplied control signals for each power semiconductor a control current and/or a control voltage. The control assembly 32 also includes a desaturation monitor that generates feedback signals. Since the control and feedback signals are transmitted optically, the control assembly includes several components of the required opto-couplers. Due to the desaturation monitoring, this control assembly 32 is not only electrically connected with the control inputs, but also with the AC-side terminals of the power modules 28. In addition, an auxiliary mounting frame 34 is mounted on the two mounting plates 16 of the two-sided cooling units 12 and 14, with encompasses the auxiliary mounting frame 34 from several sides. The auxiliary mounting frame 34 is designed to secure and support the aforementioned components during assembly.

The exploded view also shows a support 36 for capacitors 38 of the intermediate circuit capacitor battery 10. As seen in FIG. 1, the mounting frame 6 above the cooling unit 8 has two lateral sheet metal units 44 and 46, which form a channel for the cooling means. There front face 46 of the mounting frame 6 also includes two handling devices 48 and 50 which are attached to the lower and upper portions of the front face 46. These handling devices 48 and 50 can be used to insert the converter unit 2 into the aforementioned based frame 4 depicted in FIG. 7, or pulled out from the base frame 4. The lateral sheet metal unit 40 is not only used to form the upper part of the mounting frame 6 into a finished channel, but primarily as a mounting plate of the current rail system 52. Another plate 54 made out of an insulating material is also mounted on the sheet metal unit 40, which separates the electrical potential between the mounting frame 6 and the current rails 22, 24 and 26 while simultaneously supporting the current rails 22, 24 and 26. For this purpose, the sheet metal unit 40 has three spacer elements 56.

Figure 2:
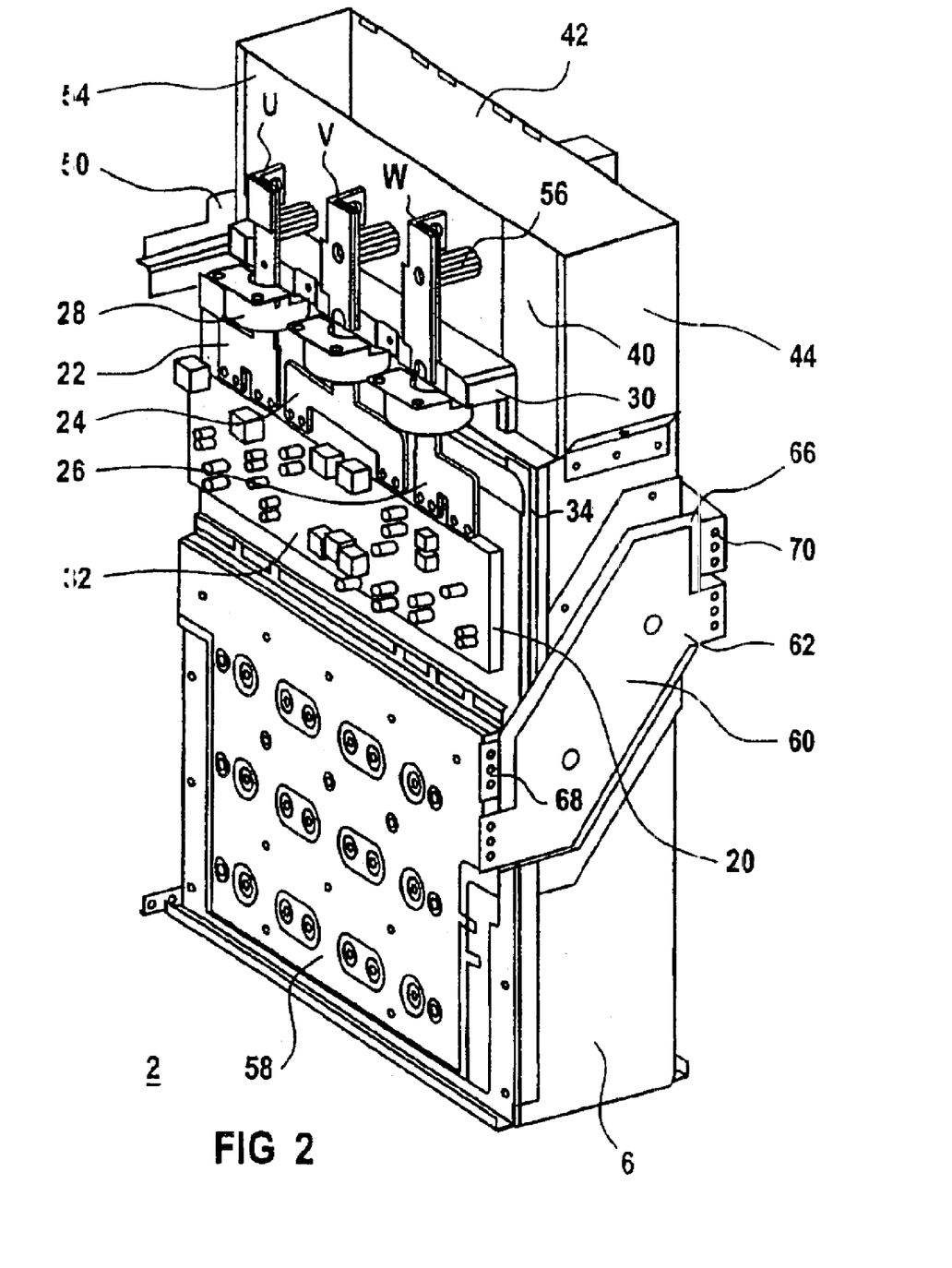
FIG. 2 is a perspective illustration of one side of the converter unit of FIG. 1 in assembled state.

FIG. 2 is an oblique rear view of the assembled converter unit 2, showing the right side and the backside of the converter unit 2. Also visible in FIG. 2 is an intermediate circuit rail system 58 and a rail section 60. The intermediate circuit rail 50, on one hand, connects the, capacitors 38 of the intermediate circuit capacitor battery 10 electrically in parallel and in series and, on the other hand, also closes the sides of the lower section of the mounting frame 6. As a result, the right side of the mounting frame 6 is completely closed off. The rail section 60 is secured to the backside of the converter unit 2 and routes the two potentials of the intermediate circuit capacitor battery 10 to the left side of the converter unit. In other words, the rail section 60 represents a connecting element between two power components of the converter unit 2 that are connected in common to the intermediate circuit capacitor battery 10. The rail section 60 has two parallel current rails 62 and 64 which are isolated from each other by an insulating foil 66. Due to the insulating foil 66, only the terminals 68 and 70 of the current rail 64 are visible.

Figure 3:
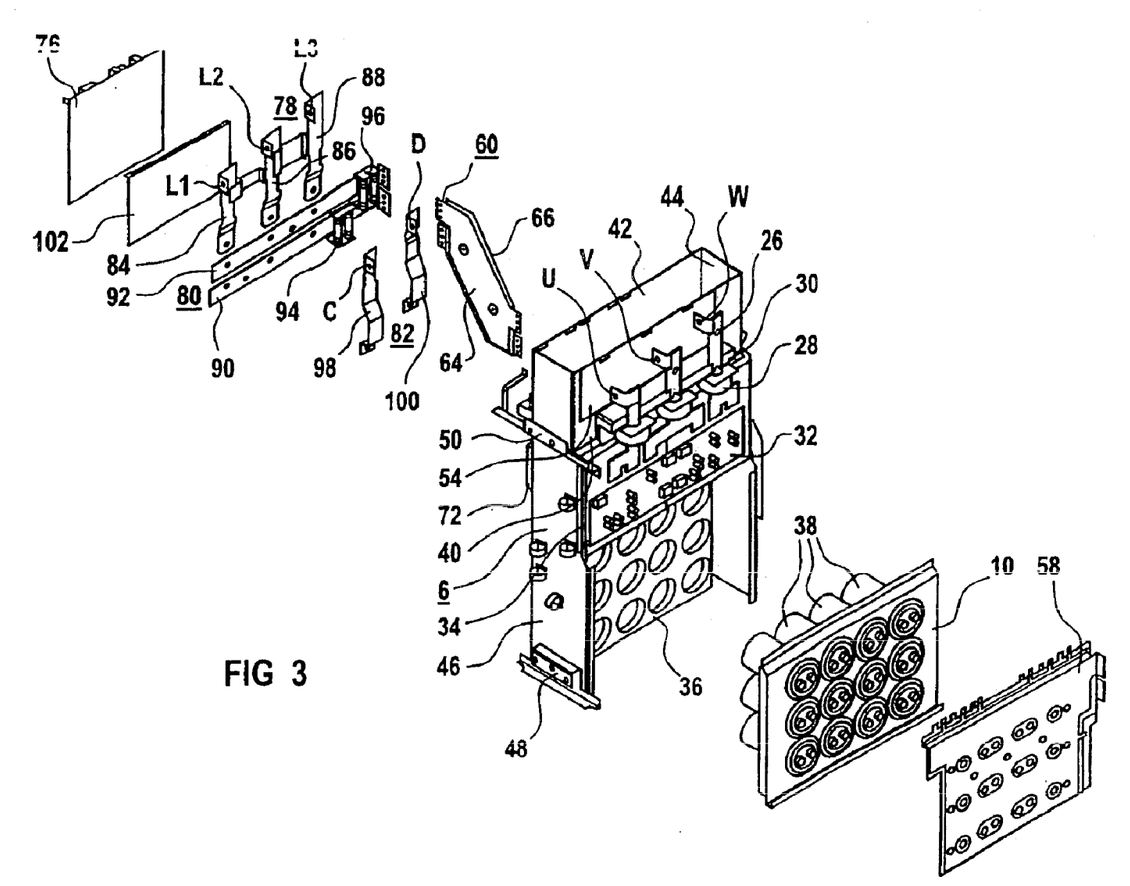
FIG. 3 shows an exploded perspective view of another portion of the converter unit of FIG. 1.

FIG. 3 also shows in an exploded view a converter unit 2, wherein the parts shown in the exploded view of FIG. 1 are depicted here in an assembled state. FIG. 3 shows those parts of the converter unit 2 that are attached to the left side of the converter unit 2. These parts include additional power semiconductors 72, in particular branch modules, which are already mounted on the second support plate 74 of the two-sided cooling unit 8.

The power semiconductors 72 also include a control assembly 76. Also depicted are three current rail systems 78, 80 and 82. The current rail systems 78 has three current rails 84, 86 and 88, each of which is electrically connected with a corresponding AC-side terminal of a branch module. The free ends of these current rails 84, 86 and 88 form each a corresponding terminal L1, L2 and L3. The current rail system 80 includes two parallel current rails 90 and 92 which each connect a DC-side terminal of the branch modules 72 with each other. The current rails 90 and 92 therefore extend horizontally over the entire depth of the converter unit 2. The current rails 90 and 92 are each connected with a corresponding current rail 62 and 64 of the rail section 60. In addition, each current rail 90 and 92 is electrically connected with a respective terminal of a resistor arrangement 94 and 96. The resistor arrangement 94 and 96 in this case consists of two resistors electrically connected in parallel, whereby each of the respective free ends of the resistors is electrically connected with a corresponding terminal of the control assembly 76. The third current rail system 82 also includes two current rails 98 and 100, which are each electrically connected with a corresponding current rail 90 and 92 of the current rail system 80. The free ends of these two current rails 98 and 100 form respective terminals C and D. In this way, the potentials of the intermediate circuit capacitor battery 10 are routed to the outside of the converter unit 2, providing a suitable connection, for example, for a chopper resistor. Furthermore, a plate 102 made of an insulating material that separates the electrical potential between the mounting frame 6 and the current rail systems 78 and 89, and also separates the electrical potential between the mounting frame 6 and the current rails 84, 86, 88 and 98, 100, and also supports the current rails 84 to 100, is located on the left side of the converter unit 2.

Figure 4:
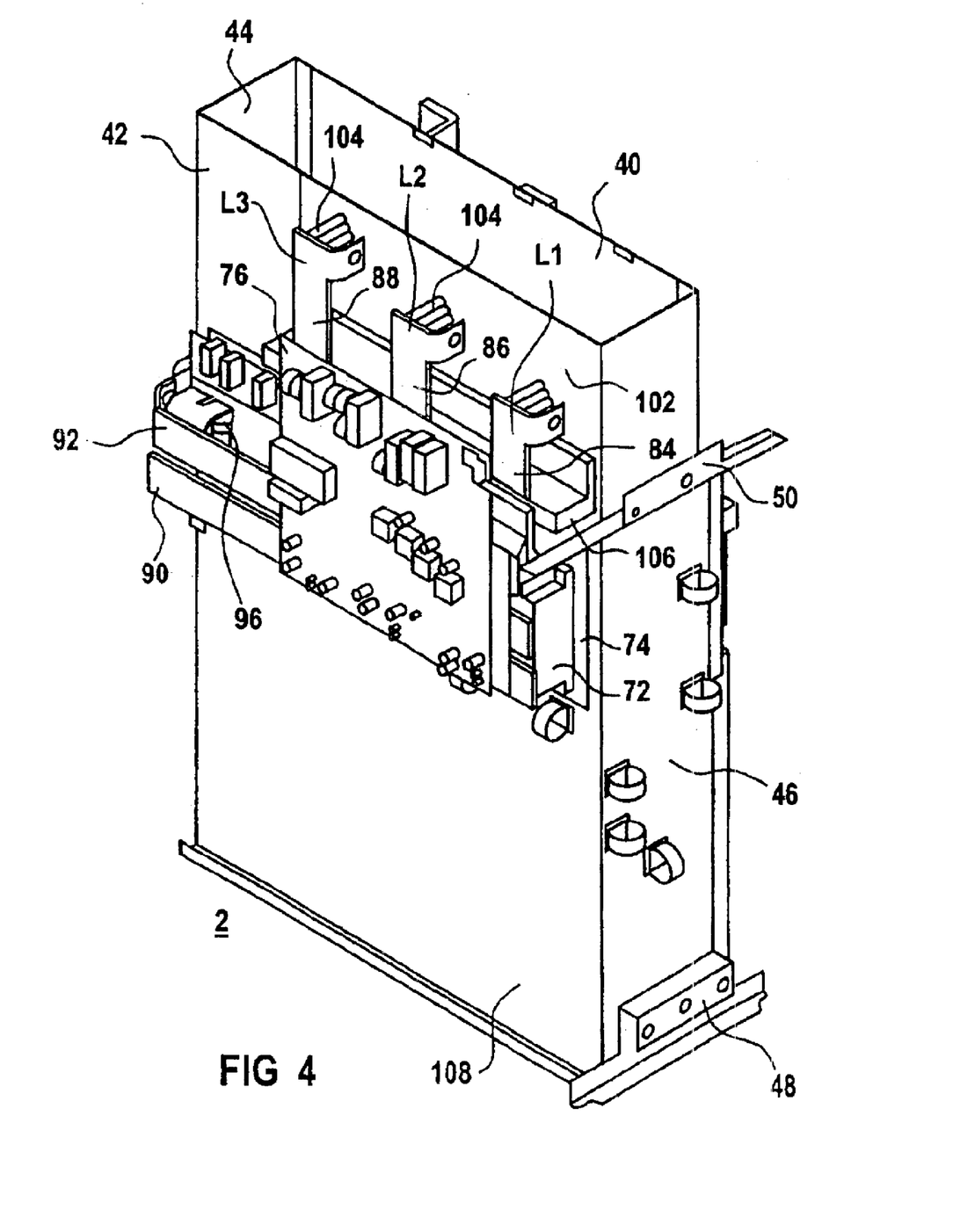
FIG. 4 is a perspective view of another side of the converter unit of FIG. 3 in assembled state.

FIG. 4 shows the mounted left side of the converter unit 2. As seen in FIG. 4, the plate 102 also includes spacer elements 104 for affixing the free ends of the current rails 84, 86 and 88. A mounting aid 106 is provided in addition to the spacer elements 104. The lower section of the converter unit 2 also includes a cover plate 108 for closing the region of the intermediate circuit capacitor battery. This arrangement now forms a completed channel for the cooling medium in the mounting frame 6.

Figure 5:
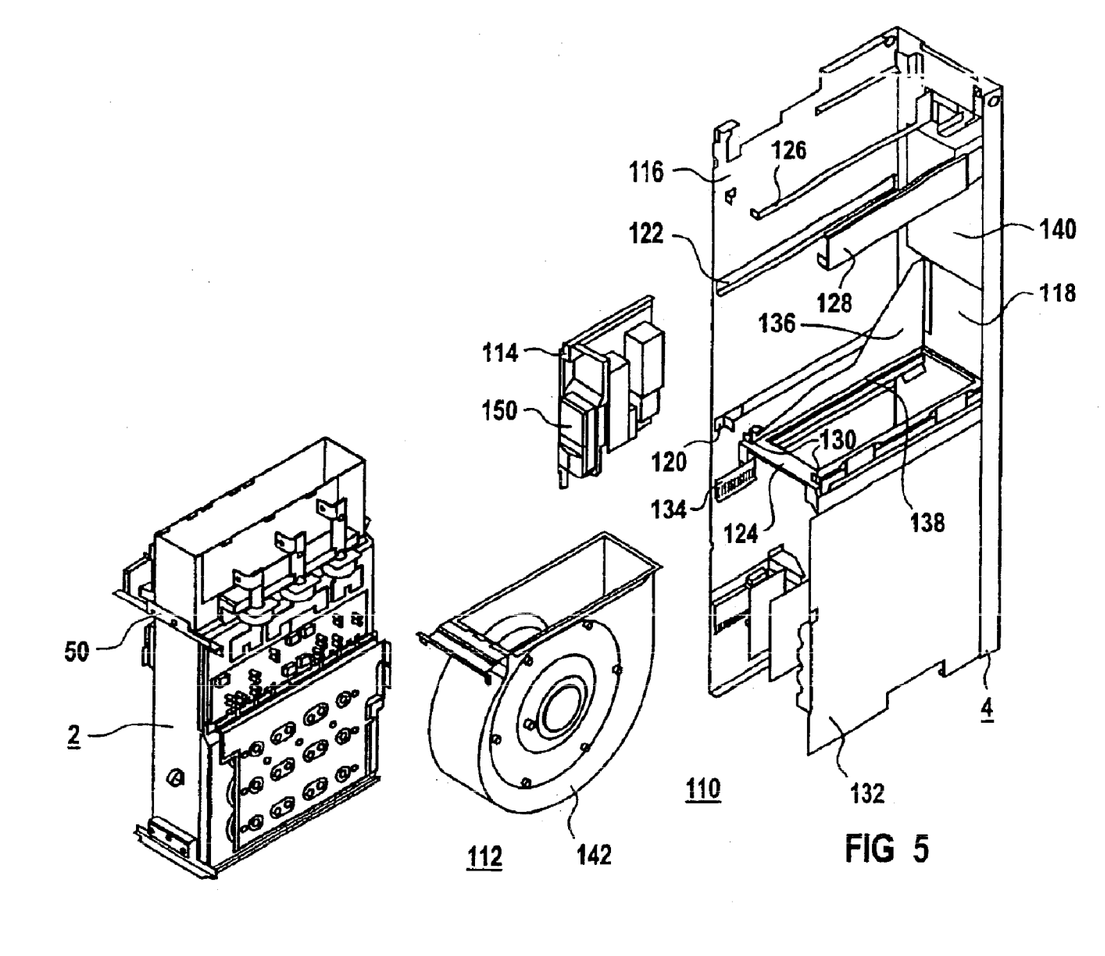
FIG. 5 is an exploded perspective view of a converter assembly with the converter unit of FIG. 2.

FIG. 5 shows an exploded view of a converter assembly 110 consisting of a converter unit 2 according to FIG. 2, a fan unit 112, an electronic unit 114 and a base frame 4. Only one fan 142 is depicted for sake of clarity. The components 2, 142 and 114 are inserted into the base frame 4. The base frame 4 also includes various guide rails. The base frame 4 consists of a sidewall 116 and a back wall 118, which are connected with each other at right angles. The back wall 118 is also provided with a right-angled mounting strip. The inside of the sidewall 116 has two guide rails 120 and 122 which are spaced apart and adapted to receive the fan 142 of the electronic unit 114. A support frame 124 and two reinforcement bars 126 and 128 are arranged on the back wall 118 of the base frame 4, wherein the reinforcement bar 128 is implemented as a cover panel. The bottom side of the support frame 124 includes two lateral guide channels adapted to receive the fan 142 of the fan unit 112, whereas its top side includes two stop plates 130. The support frame 124 is supported on one side over the entire depth by a side plate 132, whereas the other side is only supported by a support brace 134. The support frame 124 includes a mounting flange 136 for attaching the support frame 126 to the rear wall 118 of the base frame 4. The mounting flange 136 is connected over its entire depth with the left brace 138 of the support frame 124. The mounting flange 136 simultaneously guides the converter unit 2 when the converter unit 2 is inserted into the base frame 4. The rear wall 118 has a spacer element 140 in the region where the converter unit 2 is inserted, so that the handling means 50 of the converter unit 2 can form a front panel cross brace when the converter unit 2 is inserted.

Figure 6:
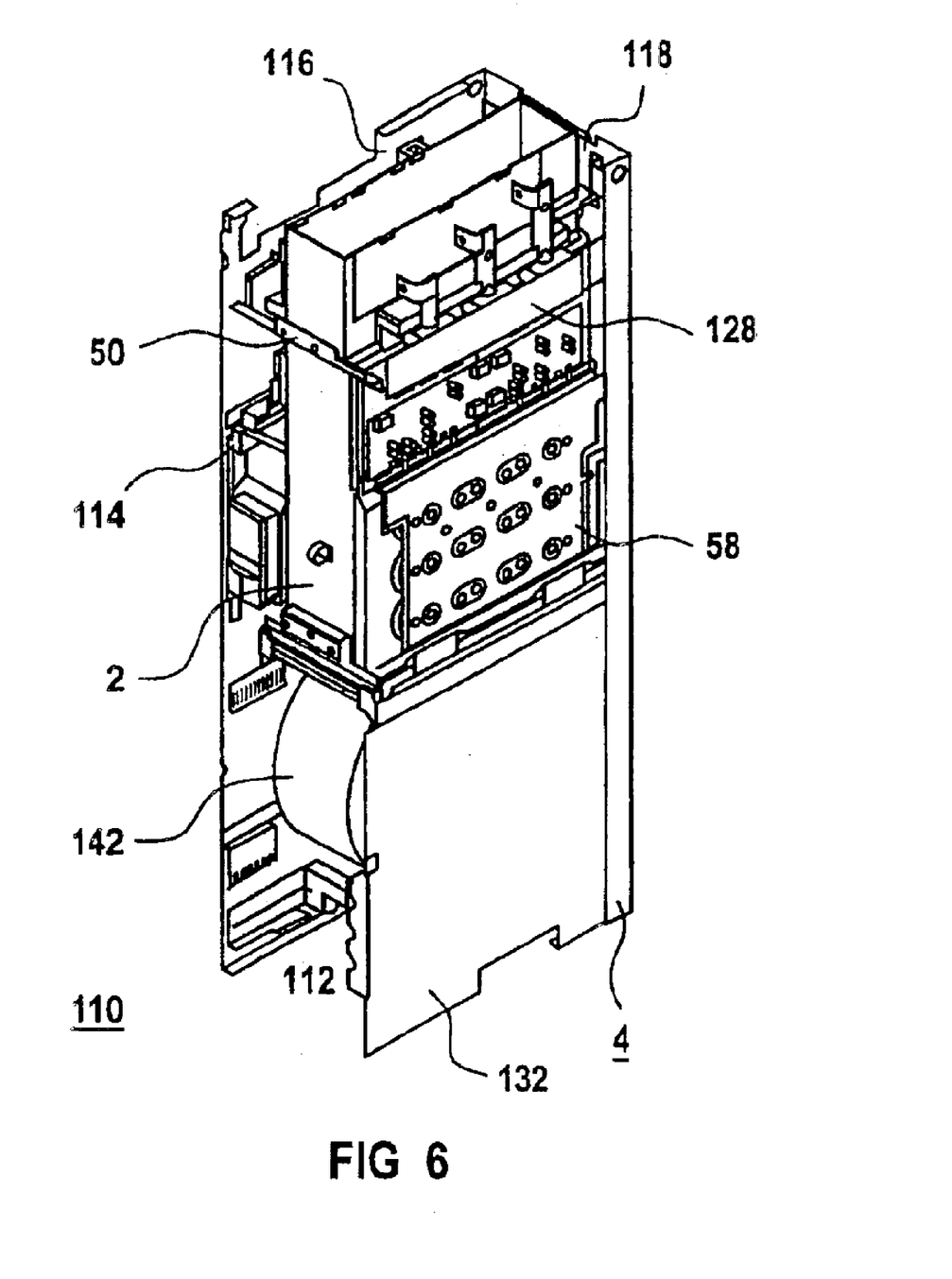
FIG. 6 is a perspective illustration of the converter assembly of FIG. 5 in assembled state.

FIG. 6 shows the converter assembly 110 in a mounted state. As seen in FIG. 6, the fan 142 of the fan unit 112 is inserted directly below the converter unit 2, whereby the electronic unit 114 is inserted next to the converter unit 2. Additional components of the fan unit 112 are placed in the region below the fan 142. In the mounted state, the side plate 132 and the intermediate circuit rail system 152 of the converter unit 2 form a partial cover on the right side of the converter assembly 110. The converter assembly 110 is closed off on the left and on the rear by the sidewall 116 and the rear wall 118. For this reason, there exists sufficient space for installing the electronic unit 114 only between the converter unit 2 and the sidewall 116. The electronic unit 114 is framed here on the side by two plates, namely the sidewall 116 of the converter assembly 110 and the cover plate 108 of the converter unit 2, which hence shield the electronic unit 114. The fan unit 112 includes, in addition to the fan 114, a fan transformer 114 with an associated fuse. The fan transformer 144 can have several taps on the primary winding for operating the fan 142 with different line voltages. An AC fan is used instead of a DC fan to save cost. Since components are mounted on both sides of the cooling unit 12 and 14, the fan 142 must be capable of generating a relatively high pressure. The fan 142 can be implemented as a radial fan or as a cylindrical rotor. A 4-pole fan 142 operating at a rotation speed of, for example, approximately 1400 RPM can be used to reduce the: noise level. Advantageously, the AC fan is a 3-phase fan, whereby the rotation speed of the fan at 60 Hz operation can be kept at a level of 50 Hz. The noise level at both operating points is then the same. This is not possible with single-phase fans, since the produced power loss is significantly greater and requires expensive motors.

The electronic unit 114 includes an interface assembly 146, a control assembly, a power supply 148 and an operating unit 150. The control assembly includes a field control and a pulse-width modulator, which provides at its output the control signals. The interface assembly 146 is implemented as an identification card or as an ID card of the converter unit 2, so that the control assembly can receive information about the power components arranged in the converter unit 2. The interface assembly 146 is part of the converter unit 2, which is housed in the electronic unit 114 to separate the signaling electronics from the power electronics.

FIG. 7 shows a more detailed block diagram of the converter assembly 110 according to FIG. 6. This block diagram also includes a block diagram of the converter unit 2 which due to its configuration is also referred to as power block. The converter assembly 110 depicted in FIG. 6 represents a basic assembly. Only the interface assembly 146 and the power supply assembly 148 of the electronic unit 114 are shown in this block diagram of the converter assembly 110. The fan unit 112 includes, in addition to the fan 142 and the fan transformer 144, also a fan electronic assembly 152 which monitors the rotating field of the fan supply voltage on the secondary side of the fan transformer 144. If a right-handed rotating field is not connected during installation of the converter assembly 110, then the fan electronic assembly 152 rotates the phase. The phase is rotated during the switch-on process after the power supply assembly has been turned on, but with the fan 142 switch off. The fan electronic assembly 152 also includes fan relays for switching the fan 142 on and off. The fan electronic assembly 152 receives power from the power supply assembly 148. This fan electronic assembly 152 is arranged in the region of the fan transformer 140 which is located below the fan 142. The fan electronic assembly 152 is designed for a contamination level 3, since this region may experience an elevated contamination level.

The block diagram of the converter unit 2 shows a rectifier and an inverter which are linked on their respective DC-sides by the intermediate circuit capacitor battery 10. Since the intermediate circuit capacitor battery 10 is composed of several capacitors 78, the capacitor battery 10 also includes symmetrizing resistors shown here as an equivalent circuit diagram. The rectifier consists of a fully controlled thyristor bridge in B6-configuration. The thyristors are controlled by the control assembly 76 which is also used to pre-charge the intermediate circuit capacitor battery 10 and to generate trigger pulses for the thyristors in AC/AC devices. In addition, a line overvoltage protection circuit is integrated into the control assembly for protecting the converter assembly 110 against brief overvoltage spikes. In addition, a basic interference suppression is integrated into this control assembly 76. In other words, the ground connection of this circuit can easily be removed when operation in international power grids by loosening a screw which is accessible from the front.

The control assembly 76 includes in addition to six thyristor controllers an auxiliary rectifier for pre-charging the intermediate circuit capacitor battery 10. The assembly 76 also includes a circuit for recognizing a phase failure of the power line voltage. When a phase of a power line fails, the control electronics receives an error signal via the interface assembly 146. The thyristor controllers receive an enable signal from a modulator of the control assembly via the interface assembly 146. The thyristor controllers ensure that the thyristors are always triggered at their expected trigger point. The thyristor rectifier then operates essentially like a reversible rectifier.

With the full-wave bridge converter, ground fault resistance can be achieved even when the device is switched in. With a half wave bridge converter, a ground fault could occur by way of the power line diodes, the intermediate circuit and the free-wheeling diodes in the inverter. The main current path is inhibited by switching the enable signal off, which limits the current through the pre-charging resistors. However, the output currents must be monitored to prevent output currents in standby operation. With the enable signal is switched off, an error message has to be transmitted to protect the pre-charging resistors, and the device has to be switched at zero voltage.

A conventional suppressor circuit is not required since the rectifier is always operated at $\alpha=0°$. Since the intermediate circuit capacitor battery 10 is connected with the rectifier 72 through a small inductance, i.e., there are no chokes in the voltage intermediate circuit, the capacitor battery 10 has a voltage-limiting effect. The circuit is implemented by the pre-charging resistors in connection with the pre-charging rectifier and the capacitor connected in parallel thereto.

The mechanical dimensions of the installation space 6 are determined by the power modules employed in the inverter, in particular the IGBT modules. Advantageously, the IGBT modules are implemented in a six-pack configuration. Such module can be designed cost-effectively, with the individual switches arranged in the form of a six-pack. The inverter can be constructed using one, two or three six-packs. When using only one six-pack, then the inverter has only one controller. When using two six-packs, which are electrically connected in parallel of the DC-side, the three inverter phases U, V, W are formed. The associated control assembly 32 connects both modules 18 and 20. If three six-packs are electrically connected in parallel of the DC-side, then each six-pack module represents a phase module of the inverter. Each phase module has a dedicated controller which is integrated on a control assembly which can be a single control assembly 32.

Figure 8:
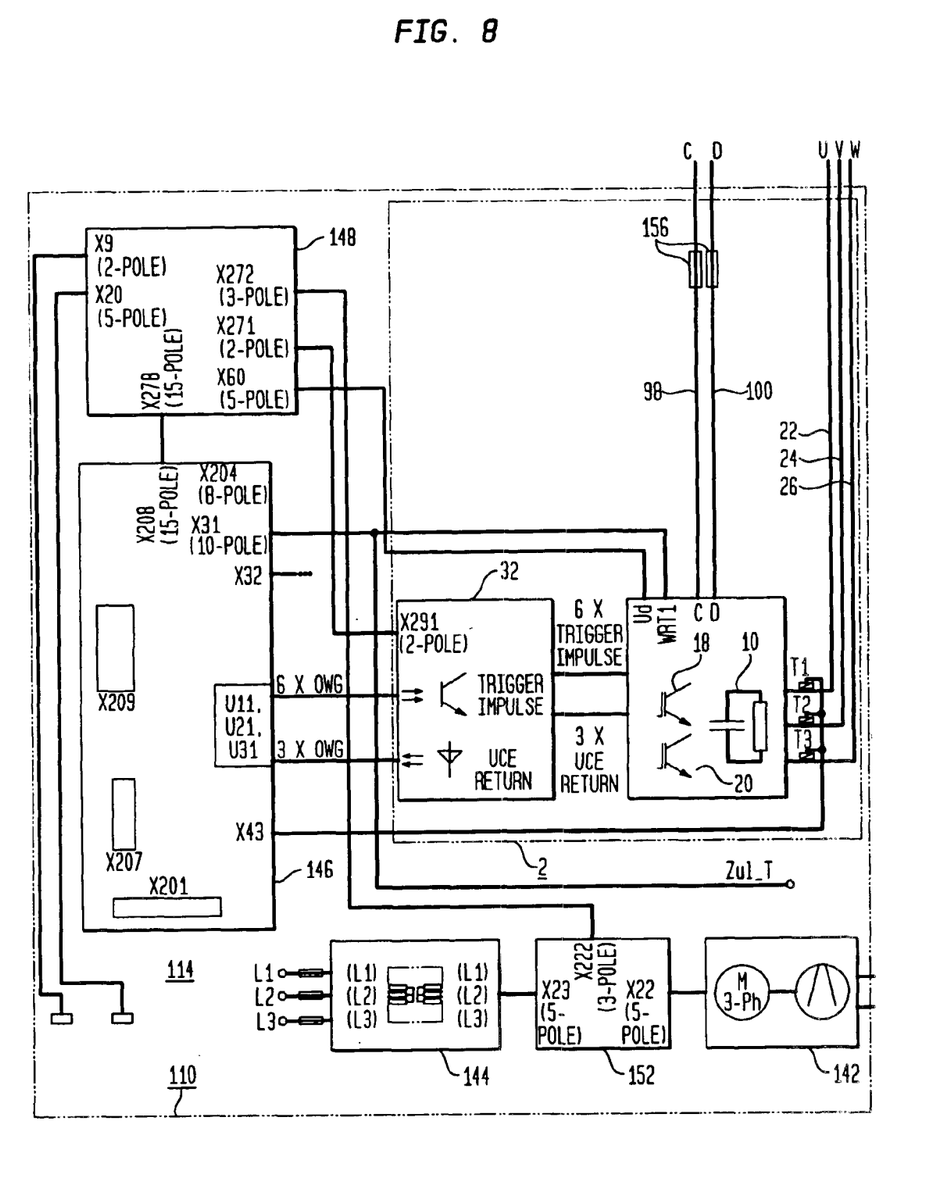
FIG. 8 shows a schematic block diagram of another embodiment of a converter assembly.

FIG. 8 also shows a block diagram of a converter assembly 110. Unlike in the block diagram of FIG. 7, the block diagram of the converter unit 2 does no longer include a rectifier with a corresponding control assembly 76. This basic assembly represents an inverter. Such inverters are used, for example, in a multi-motor drive system, wherein each motor is powered by an inverter and all inverters are powered from a common DC voltage supply. The associated converter unit 2 is different from the converter unit 2 used with the converter assembly 110 of FIG. 7 in that no power semiconductors are mounted on the left side of the cooling unit(s). This approach eliminates all the components which are illustrated of the left side in the exploded view of FIG. 3. The converter unit 2 can be connected to a DC voltage supply by bringing the two DC potentials of the intermediate circuit capacitor battery 10 out of the current converter unit 2 via the current rails 98 and 100. In all other aspects, there is no difference between the two converter assemblies 110 in FIGS. 7 and 8.

Figure 9:
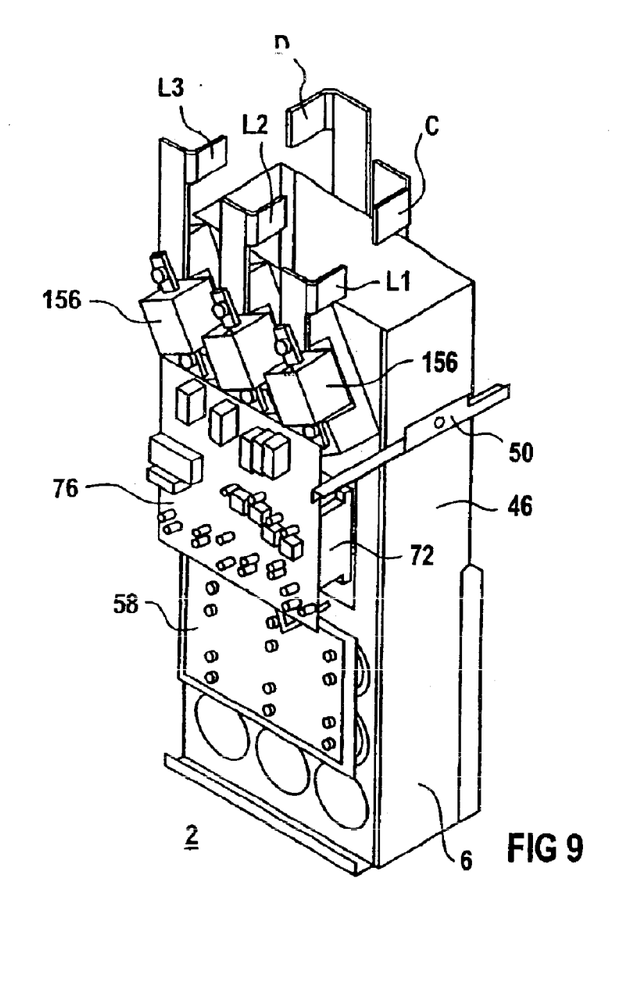
FIG. 9 shows a top and left-hand side perspective view of a another embodiment of a converter unit according to the present invention.
Figure 10:
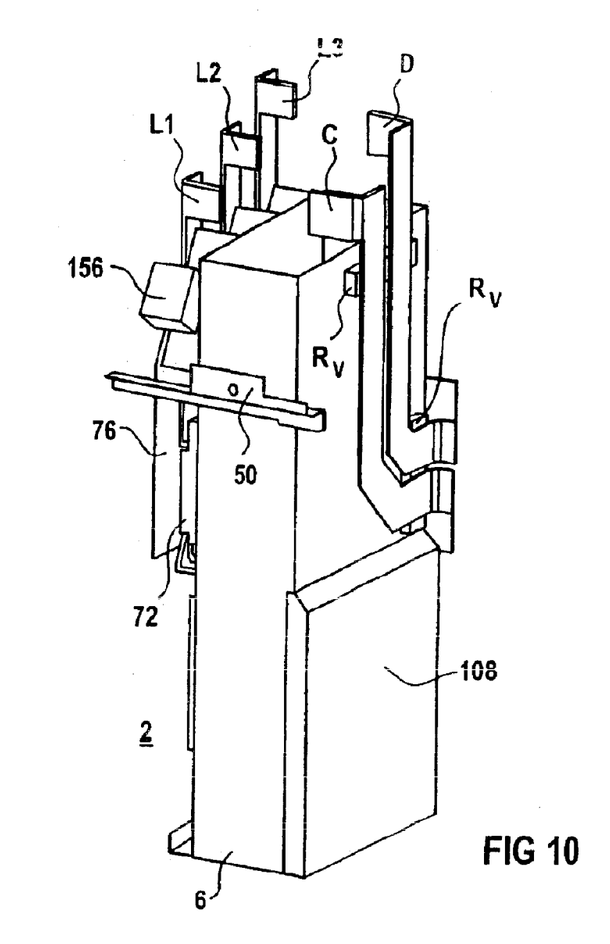
FIG. 10 shows a top and right-hand side perspective view of the converter unit of FIG. 9.

FIGS. 9 and 10 show perspective views of the same converter unit 2 from the left-hand side and right-hand-side, respectively. The converter unit 2 represents a rectifier which is constructed according to the aforedescribed power-block concept. According to one feature of the power-block concept, a cooling unit 8 is arranged in a mounting frame 6, with an intermediate circuit capacitor battery 10 disposed underneath the cooling unit 8. The converter unit 2 operates as a rectifier and includes semiconductor fuses 156 in addition to the power semiconductors 72, the control assembly 76, the intermediate circuit rail 58 of the intermediate circuit capacitor battery 10. Moreover, the intermediate circuit capacitor battery 10 is inserted not on the right side, but rather on the left side of the converter unit 2. In this embodiment of the converter unit 2, the pre-charging resistors $R_V$ are arranged on the right side of the cover plate 108, which in this embodiment of a converter unit 2 closes the entire right side of the mounting frame 6.

Figure 11:
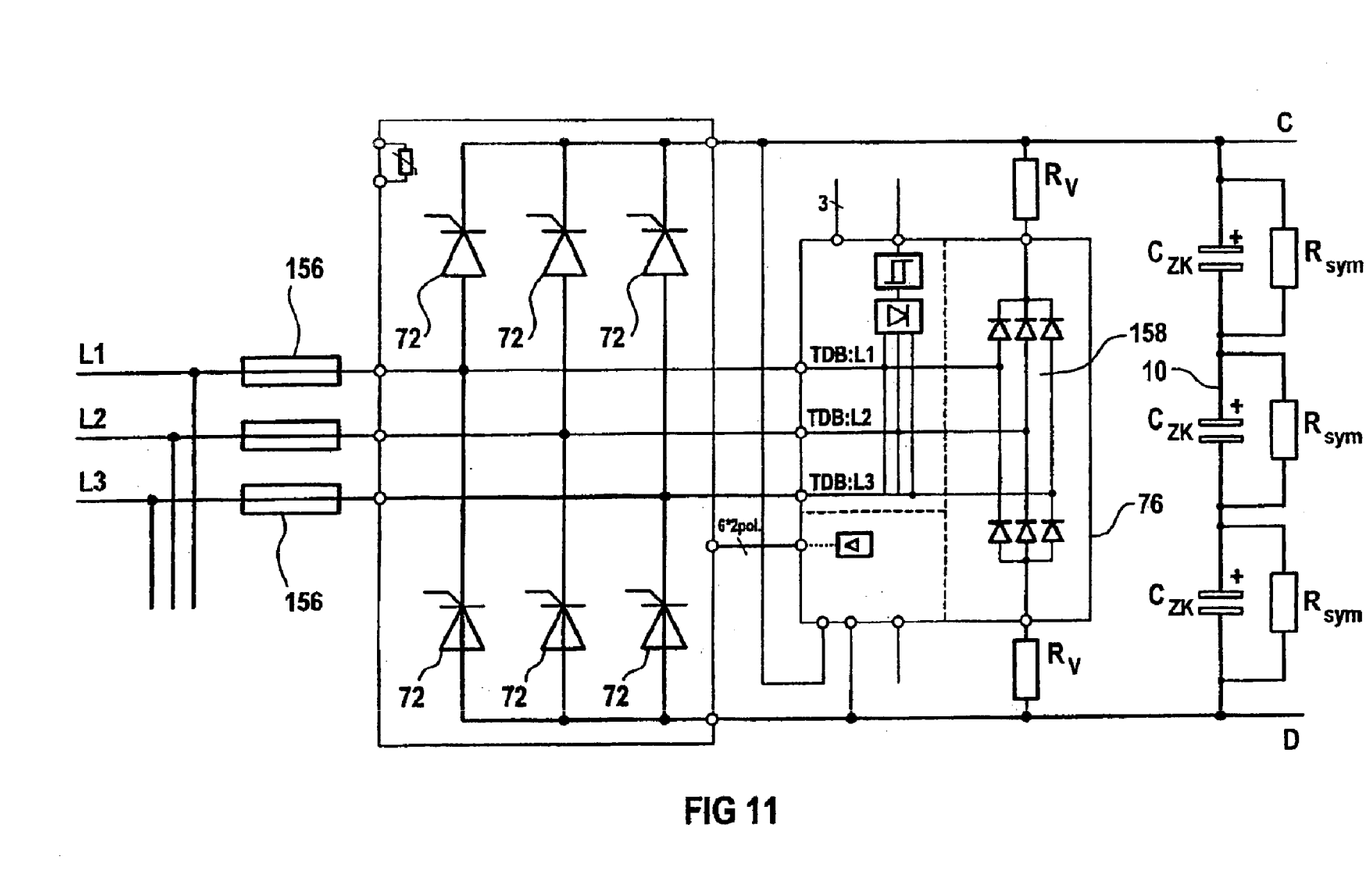
FIG. 11 shows a schematic block diagram of the converter unit of FIG. 10, embodied as a 6-pulse/3-phase bridge circuit.
Figure 12:
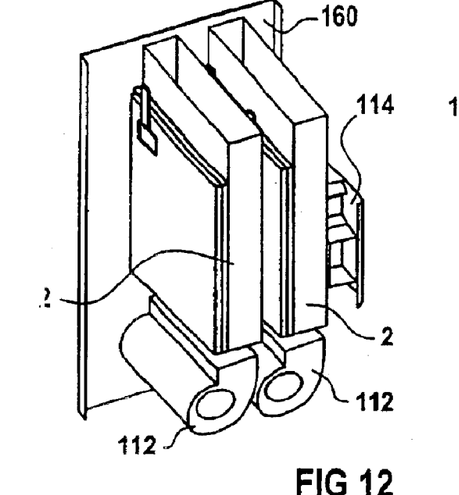
FIGS. 12 to 15 show perspective views of converter assemblies with different combinations of converter units according to FIG. 2 and FIG. 9.

According to the block diagram of the converter unit 2 of FIG. 11, the rectifier is constructed as a 6-pulse 3-phase bridge circuit. Wherever possible, thyristor modules are employed, whereas diode modules are used at higher power ratings. The thyristor rectifiers advantageously do not require a master switch or an auxiliary voltage supply during the voltage ramp-up. They are therefore less costly than a diode rectifier with a master switch. The thyristors are controlled by the control assembly 76, which also includes an auxiliary rectifier 158 for pre-charging, as described above. The intermediate circuit capacitor battery 10 is pre-charged via respective resistors $R_V$ located in the positive and negative arms of the intermediate circuit capacitor battery 10. The auxiliary rectifier 158 (B6 diode bridge) of the control assembly 76 powers the intermediate circuit capacitor battery 10 from the power line via the pre-charging resistors $R_V$. The pre-charging circuit is dimensioned so that a total intermediate circuit capacitance $C_{ZK}$ can be charged that is equal to four times the rectifier intermediate circuit capacitance. The current produced by the symmetry resistors $R_{sym}$ also flows through the pre-charging circuit. The pre-charging resistors $R_V$ are sized to provide a pre-charging time of, for example, 3.5 seconds. It is assumed here that the intermediate circuit capacitor battery is charged during this time to 95% of the peak value of the line voltage.

FIGS. 12 to 15 show various combinations of converter units 2. According to FIG. 12, two converter units 2 with associated fan units 112 and an electronic unit 114 are arranged in a frame, wherein for sake of clarity only the rear wall 160 of the frame is shown. A converter unit 2 includes a rectifier and one phase of an inverter, whereby the second converter unit 2 includes two additional phases of the inverter. This combination of the two different converter unit 2 represents an AC/AC converter arrangement.

Figure 13:
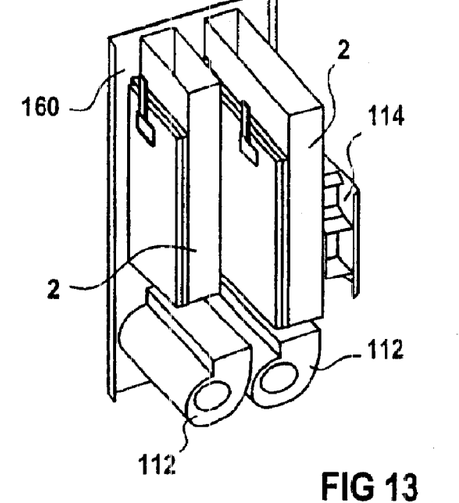

FIG. 13 also shows two converter units 2 together with corresponding fan units 112 and an electronic unit 114 arranged on a rear wall 160. In this arrangement, the right converter unit 2 includes two phases of an inverter, whereas the third phase of this inverter is implemented in the left converter unit 2. This combination of two converter units 2 represents here a DC/AC converter arrangement.

Figure 14:
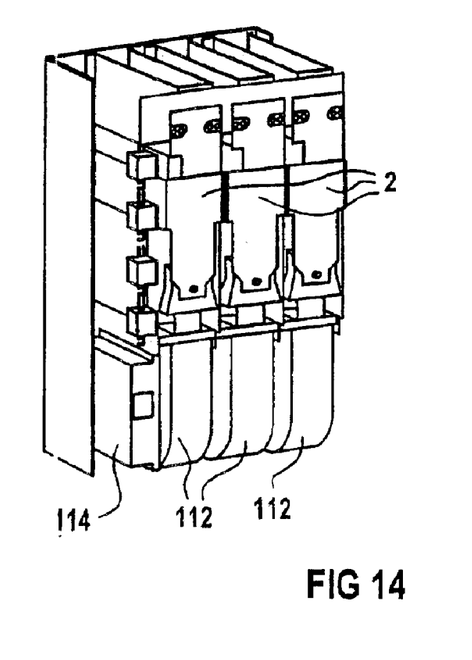
Figure 15:
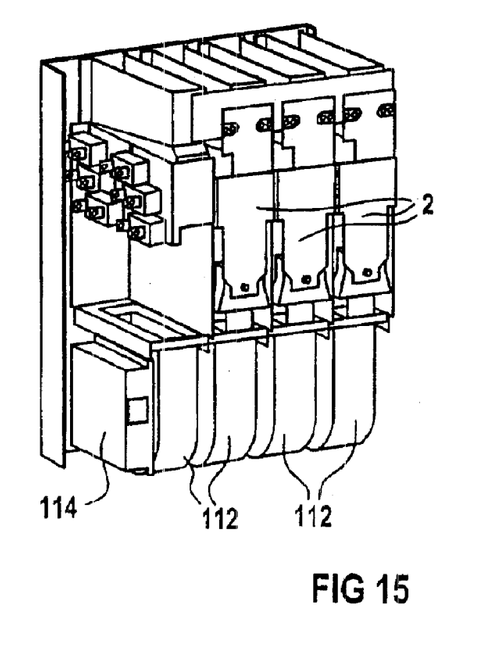

For higher power ratings, each inverter phase can be implemented using a separate converter unit 2. A DC/AC converter assembly is realized by arranging three converter units 2 and one electronic unit 114 side-by-side on a rear wall, as shown in FIG. 14. Each converter units 2 has here a dedicated fan unit 112.

This DC/AC converter arrangement can be expanded to an AC/AC converter arrangement by adding only one additional converter unit 2. This converter unit 2 is then implemented according to FIG. 9. The additional converter unit 2 (rectifier) is not fully shown in FIG. 15. Again, each converter unit 2 has a dedicated fan unit 112.

The illustrated combinations are by no means meant to be exhaustive. The number of converter units 2 that can be combined depends on the desired power rating of the converter arrangement and its configuration (converter, inverter, mufti-motor drive system). However, the same cooling unit can be used with all converter units 2 independent of the number of the converter units 2 that are combined. By configuring the converter unit 2 according to the invention in conjunction with the fan unit 112 associated with the converter unit 2, an entire low-cost series of can be designed that span a wide power range, whereby each unit has a modular construction.

The converter units 2 can be water-cooled instead of air-cooled, which does not change the basic design of the converter units 2 or of the combination of several converter units 2. The capacitors 38 of the intermediate circuit capacitor battery 10 can also be water-cooled.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth the appended claims and includes equivalents of the elements recited therein.

What is claimed is:

1. A converter unit of modular construction, comprising:
   a mounting frame;
   an intermediate circuit capacitor battery secured to the mounting frame and including a plurality of capacitors;
   a two-sided cooling unit constructed to support components on both sides of the cooling unit, said cooling unit being secured to the mounting frame above the intermediate circuit capacitor battery and including at least a first mounting plate;
   at least one power semiconductor mounted on the first mounting plate and having a control input connected to a terminal of a control assembly;
   an intermediate circuit rail system for electrically connecting the plurality of capacitors of the intermediate circuit capacitor battery with each other and with a DC-side terminal of the at least one power semiconductor;
   at least one current rail electrically connected with a corresponding AC-side terminal of the at least one power semiconductor; and
   at least one cover plate covering the mounting frame so as to form an air channel.

2. The converter unit of claim 1, and further comprising at least one additional power semiconductor having a control input and mounted on a second mounting plate of the two-sided cooling unit, with the control input of the at least one additional power semiconductor being connected to a terminal of an additional control assembly; a first additional current rail electrically connected with a corresponding AC-side terminal of the at least one additional power semiconductor and a second additional current rail, which is electrically connected with a corresponding DC-side terminal of the at least one additional power semiconductor; and a rail section which electrically connects the DC-side terminal of the at least one additional power semiconductor with the intermediate circuit rail system located on the opposite side of the mounting frame.

3. The converter unit of claim 1, wherein the at least one current rail includes a current sensor.

4. The converter unit of claim 1, and further comprising a semiconductor fuse arranged between the AC-side terminal of the at least one power semiconductor and the at least one current rail; and a pre-charging resistor mounted on the first mounting plate of the cooling unit and connected between a DC-side terminal of the intermediate circuit capacitor battery and the terminal of the control assembly.

5. The converter unit of claim 2, and further comprising a semiconductor fuse arranged between the AC-side terminal of the at least one additional power semiconductor and the first additional rail; and a pre-charging resistor mounted on the first mounting plate of the cooling unit and connected between a DC-side terminal of the intermediate circuit capacitor battery and the terminal of the additional control assembly.

6. The converter unit of claim 1, wherein the at least one power semiconductor is implemented as at least one six-pack module.

7. The converter unit of claim 2, wherein the at least one additional power semiconductor is implemented as a thyristor.

8. The converter unit of claim 1, wherein the cooling unit is implemented as an air-cooled unit.

9. The converter unit of claim 1, wherein the cooling unit is implemented as a liquid-cooled unit.

10. The converter unit of claim 9, wherein the liquid-cooled cooling unit is configured so that the capacitors of the intermediate circuit capacitor battery are liquid-cooled.

11. A converter assembly, comprising:

a base frame;

a fan unit and an electronic unit inserted into the base frame, a converter unit inserted into the base frame and including a mounting frame;

an intermediate circuit capacitor battery secured to the mounting frame and including a plurality of capacitors;

a two-sided cooling unit constructed to support components on both sides of the cooling unit, said cooling unit being secured to the mounting frame above the intermediate circuit capacitor battery and including at least a first mounting plate;

at least one power semiconductor mounted on the first mounting plate and having a control input connected to a terminal of a control assembly;

an intermediate circuit rail system for electrically connecting the plurality of capacitors of the intermediate circuit capacitor battery with each other and with a DC-side terminal of the at least one power semiconductor;

at least one current rail which is electrically connected with a corresponding AC-side terminal of the at least one power semiconductor; and at least one cover plate covering the mounting frame so as to form an air channel, wherein the fan unit is arranged below the converter unit, and the electronic unit is arranged next to the converter unit.

12. The converter assembly of claim 11, wherein the converter unit includes at least one additional power semiconductor having a control input and mounted on a second mounting plate of the two-sided cooling unit, with the control input of the at least one additional power semiconductors being connected to a terminal of an additional control assembly; and further comprising a first additional current rail electrically connected with a corresponding AC-side terminal of the at least one additional power semiconductor and a second additional current rail, which is electrically connected with a corresponding DC-side terminal of the at least one additional power semiconductor; and a rail section for electrically connecting the DC-side terminal of the at least one additional power semiconductor with the intermediate circuit rail system located on the opposite side of the mounting frame.

13. The converter assembly of claim 11, and further comprising at least one assembly cover adapted to close off side and front sections of the converter assembly; a power line terminal arranged on top of the converter assembly; and a motor terminal arranged underneath the converter assembly.

14. The converter assembly of claim 11 comprising at least two of said converter unit, with each converter unit having a one of said fan unit installed below the converter unit, wherein the at least two converter units are inserted side-by-side into the base frame to form a converter assembly, and wherein the electronic unit is inserted into the base frame next to the converter assembly.

15. The converter assembly of claim 14, comprising three of said converter unit.

16. The converter assembly of claim 14, comprising four of said converter unit.

17. The converter assembly of claim 12 comprising at least two of said converter unit, with each converter unit having a one of said fan unit installed below the converter unit, wherein the at least two converter units are inserted side-by-side into the base frame to form a converter assembly, and wherein the electronic unit is inserted into the base frame next to the converter assembly.

18. The converter assembly of claim 11, wherein the electronic unit includes at least one control assembly, a power supply and an interface assembly.

* * * * *